(12) United States Patent
Yang

(10) Patent No.: US 11,024,225 B2
(45) Date of Patent: Jun. 1, 2021

(54) DISPLAY SUBSTRATE, METHOD FOR MANUFACTURING THE SAME, DISPLAY PANEL AND DISPLAY APPARATUS

(71) Applicant: BOE Technology Group Co., Ltd., Beijing (CN)

(72) Inventor: Tao Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/620,120

(22) PCT Filed: Mar. 29, 2019

(86) PCT No.: PCT/CN2019/080364
§ 371 (c)(1),
(2) Date: Dec. 6, 2019

(87) PCT Pub. No.: WO2019/192399
PCT Pub. Date: Oct. 10, 2019

(65) Prior Publication Data
US 2020/0211455 A1    Jul. 2, 2020

(30) Foreign Application Priority Data
Apr. 3, 2018   (CN) .......................... 201810291802.0

(51) Int. Cl.
G09G 3/3225    (2016.01)
G09G 3/3275    (2016.01)
(Continued)

(52) U.S. Cl.
CPC ......... *G09G 3/3225* (2013.01); *G09G 3/3275* (2013.01); *H01L 27/3246* (2013.01);
(Continued)

(58) Field of Classification Search
None
See application file for complete search history.

(56) References Cited

U.S. PATENT DOCUMENTS 9,245,934 B2    1/2016  Chung et al.
2005/0052342 A1    3/2005  Wu et al.
(Continued)

FOREIGN PATENT DOCUMENTS

CN    201594377 U    9/2010
CN    103995374 A    8/2014
(Continued)

OTHER PUBLICATIONS

International search report of PCT application No. PCT/CN2019/080364 dated Jul. 1, 2019.
(Continued)

*Primary Examiner* — Christopher J Kohlman
(74) *Attorney, Agent, or Firm* — Fay Sharpe LLP

(57) ABSTRACT

The present disclosure provides a display substrate and a method for manufacturing the same, a display panel and a display apparatus. The display substrate includes: a light transmissive base substrate and a pixel unit, the pixel unit includes: a first light emitting structure and a second light emitting structure that are arranged in sequence along a direction distal from the base substrate; the first light emitting structure is configured to emit light towards a direction proximal to the base substrate, and the second light emitting structure is configured to emit light towards a direction distal from the base substrate; an orthographic projection region of the first light emitting structure on the base substrate at least partially overlaps an orthographic projection region of the second light emitting structure on the base substrate. The display panel according to the present disclosure can implement double-face display, and achieves a high resolution.

18 Claims, 14 Drawing Sheets

(51) Int. Cl.
*H01L 27/32* (2006.01)
*H01L 51/52* (2006.01)
*H01L 51/56* (2006.01)

(52) U.S. Cl.
CPC ...... *H01L 27/3258* (2013.01); *H01L 27/3267* (2013.01); *H01L 27/3272* (2013.01); *H01L 27/3276* (2013.01); *H01L 51/5218* (2013.01); *H01L 51/5234* (2013.01); *H01L 51/56* (2013.01); *G09G 2300/0426* (2013.01); *H01L 2227/323* (2013.01); *H01L 2251/5323* (2013.01)

(56) References Cited

U.S. PATENT DOCUMENTS

| | | |
|---|---|---|
| 2006/0289857 A1 | 12/2006 | Kuo |
| 2015/0048335 A1 | 2/2015 | Chung et al. |
| 2016/0240117 A1 | 8/2016 | Xu |
| 2016/0260791 A1* | 9/2016 | Fleissner ............ H01L 27/3216 |

FOREIGN PATENT DOCUMENTS

| | | |
|---|---|---|
| CN | 104377227 A | 2/2015 |
| CN | 105047167 A | 11/2015 |
| CN | 107104132 A | 8/2017 |
| CN | 107331687 A | 11/2017 |
| CN | 107863372 A | 3/2018 |
| CN | 108492771 A | 9/2018 |

OTHER PUBLICATIONS

First office action of Chinese application No. 201810291802.0 dated Jul. 11, 2019.

* cited by examiner

1401 — Providing a data signal for at least one light emitting structure of the first light emitting structure and the second light emitting structure, such that the at least one light emitting structure emits light

FIG. 14

DISPLAY SUBSTRATE, METHOD FOR MANUFACTURING THE SAME, DISPLAY PANEL AND DISPLAY APPARATUS

The present application is a 371 of PCT application No.: PCT/CN2019/080364 filed on Mar. 29, 2019, which claims priority to Chinese Patent Application No. 201810291802.0, filed on Apr. 3, 2018, the entire contents of which are incorporated herein by reference as part of the present disclosure.

SUMMARY

The present disclosure relates to a display substrate, a method for manufacturing the same, a display panel and a display apparatus.

BACKGROUND

With the developments of technologies, organic light emitting diode (OLED) display apparatuses are more and more widely used.

An OLED display substrate in the OLED display apparatus includes a base substrate and a plurality of pixel units arranged on the base substrate. The plurality of pixel units are capable of emitting light towards one side of the base substrate, such that images are displayed on one side of an OLED display substrate.

SUMMARY

The present disclosure relates to a display substrate, a method for manufacturing the same, a display panel and a display apparatus. The technical solutions as are follows.

A display substrate is provided. The display substrate comprises: a base substrate and a pixel unit;

wherein the base substrate is light transmissive, and the pixel unit comprises a first light emitting structure and a second light emitting structure that are disposed in sequence along a direction distal from the base substrate; the first light emitting structure is configured to emit light towards a direction proximal to the base substrate, and the second light emitting structure is configured to emit light towards a direction distal from the base substrate;

an orthographic projection region of the first light emitting structure on the base substrate at least partially overlapping an orthographic projection region of the second light emitting structure on the base substrate.

Optionally, the orthographic projection region of the first light emitting structure on the base substrate totally overlaps the orthographic projection region of the second light emitting structure on the base substrate.

Optionally, the first light emitting structure comprises: a first bottom electrode, a first light emitting layer and a first top electrode that are arranged in sequence along a direction distal from the base substrate; and the second light emitting structure comprises: a second bottom electrode, a second light emitting layer and a second top electrode that are arranged in sequence along the direction distal from the base substrate;

Optionally, the first bottom electrode and the second top electrode are light transmissive, and materials of at least one electrode of the first top electrode and the second bottom electrode include a light shielding material.

Optionally, the light shielding material comprises a light reflective material.

Optionally, the at least one electrode satisfies at least one of the following conditions:

the at least one electrode comprises the first top electrode, and a surface of the first top electrode proximal to the base substrate is light reflective; and the at least one electrode comprises the second bottom electrode, and a surface of the second bottom electrode distal from the base substrate is light reflective.

Optionally, the pixel unit further comprises: a first pixel circuit and a second pixel circuit;

wherein the first pixel circuit is electrically connected to the first light emitting structure, and the second pixel circuit is electrically connected to the second light emitting structure.

Optionally, the first pixel circuit and the second pixel circuit (0124) are between the base substrate and the first light emitting structure.

Optionally, the first light emitting structure comprises a first bottom electrode, a first light emitting layer and a first top electrode that are arranged in sequence along a direction distal from the base substrate;

wherein at least a portion of an orthographic projection region of the first light emitting layer on the base substrate is outside a target region, the target region comprising orthographic projection regions of the first pixel circuit and the second pixel circuit on the base substrate.

Optionally, the orthographic projection region of the first light emitting layer on the base substrate is totally outside the target region.

Optionally, the pixel unit further comprises: a first insulation layer and a second insulation layer; wherein the first insulation layer is between a pixel circuit layer and the first light emitting structure, the pixel circuit layer comprising the first pixel circuit and the second pixel circuit; and the second insulation layer is between the first light emitting structure and the second light emitting structure; and the first pixel circuit is electrically connected to the first light emitting structure by a first via hole in the first insulation layer, and the second pixel circuit is electrically connected to the second light emitting structure by a second via hole in the first insulation layer and a third via hole in the second insulation layer in sequence.

Optionally, an orthographic projection region of an edge portion of the first top electrode on the base substrate is outside an orthographic projection region of the first light emitting layer on the base substrate, the edge portion comprising a target trough hole; and the second pixel circuit is electrically connected to the second light emitting structure by the second via hole, the target through hole and the third via hole in sequence, and is insulated from the first top electrode.

Optionally, the first light emitting structure further comprises: a first defining layer between the first bottom electrode and the first top electrode, the first defining layer comprising a first opening, the first light emitting layer being in the first opening; and the second pixel circuit is electrically connected to the second light emitting structure by the second via hole, a fourth via hole in the first defining layer, the target through hole and the third via hole in sequence.

Optionally, the display substrate further comprises: a first data line and a second data line that are on the base substrate;

wherein the first data line is electrically connected to the first pixel circuit, and the second data line is electrically connected to the second pixel circuit.

Optionally, the first data line and the second data line are between the first pixel circuit and the second pixel circuit.

Optionally, the display substrate further comprises: a gate line on the base substrate, the gate line being electrically connected to the first pixel circuit and the second pixel circuit.

Optionally, the orthographic projection region of the first light emitting structure on the base substrate totally overlaps the orthographic projection region of the second light emitting structure on the base substrate;

the first light emitting structure comprises: a first bottom electrode, a first light emitting layer and a first top electrode that are arranged in sequence along a direction distal from the base substrate; and the second light emitting structure comprises: a second bottom electrode, a second light emitting layer and a second top electrode that are arranged in sequence along the direction distal from the base substrate;

wherein the first bottom electrode and the second top electrode are light transmissive, and materials of at least one electrode of the first top electrode and the second bottom electrode include a light shielding material; a surface of the first top electrode proximal to the base substrate is light reflective, and a surface of the second bottom electrode distal from the base substrate is light reflective;

an orthographic projection region of the first light emitting layer on the base substrate is totally outside a target region, the target region comprising orthographic projection regions of the first pixel circuit and the second pixel circuit on the base substrate;

the display substrate further comprises: a first data line and a second data line that are on the base substrate; wherein the first data line is electrically connected to the first pixel circuit, and the second data line is electrically connected to the second pixel circuit; the first data line and the second data line are between the first pixel circuit and the second pixel circuit; and the display substrate further comprises: a gate line on the base substrate, the gate line being electrically connected to the first pixel circuit and the second pixel circuit.

In another aspect, there is provided a method for manufacturing a display panel, wherein the method is used for manufacturing the above display panel. The method comprises:

providing a light transmissive base substrate; and forming a first light emitting structure and a second light emitting structure in sequence on the base substrate to obtain a pixel unit;

wherein the first light emitting structure is configured to emit light towards a direction proximal to the base substrate, and the second light emitting structure is configured to emit light towards a direction distal from the base substrate.

an orthographic projection region of the first light emitting structure on the base substrate at least partially overlapping an orthographic projection region of the second light emitting structure on the base substrate.

In yet another aspect, there is provided a display panel, comprising the above display substrate.

In still yet another aspect, there is provided a display apparatus, comprising: a display control component, and the above display panel;

wherein the display control component is electrically connected to a first light emitting structure and a second light emitting structure in the display panel, and is configured to control at least one of the first light emitting structure and the second light emitting structure to emit light.

Optionally, the pixel unit further comprises a first pixel circuit and a second pixel circuit, and the display panel further comprise a first data line and a second data line; and the display control component is electrically connected to the first light emitting structure by the first data line and the first pixel circuit in sequence, and is electrically connected to the second light emitting structure by the second data line and the second pixel circuit in sequence.

Optionally, the display control component comprises: two control chips; wherein one of the two control chips is electrically connected to the first light emitting structure, and is configured to control the first light emitting structure to emit light; and the other of the two control chips is electrically connected to the second light emitting structure, and is configured to control the second light emitting structure to emit light

BRIEF DESCRIPTION OF THE DRAWINGS

FIG. 14 is a flowchart of a method for controlling a display panel according to an embodiment of the present disclosure.

DETAILED DESCRIPTION

In order to describe the principles, technical solutions and advantages in the embodiments of the present more clearly, the present disclosure will be described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

With the developments of technologies, OLED display apparatuses are more and more widely used. However, an OLED display substrate in the OLED display apparatus can only display images on one side thereof. Therefore, the OLED display apparatus has a poor display effect. As known by the inventors, by configuring a double-face OLED display substrate in the OLED display apparatus, the display performance of the OLED display apparatus can be improved. However, the double-face OLED display substrate has a poor resolution.

Figure 1:
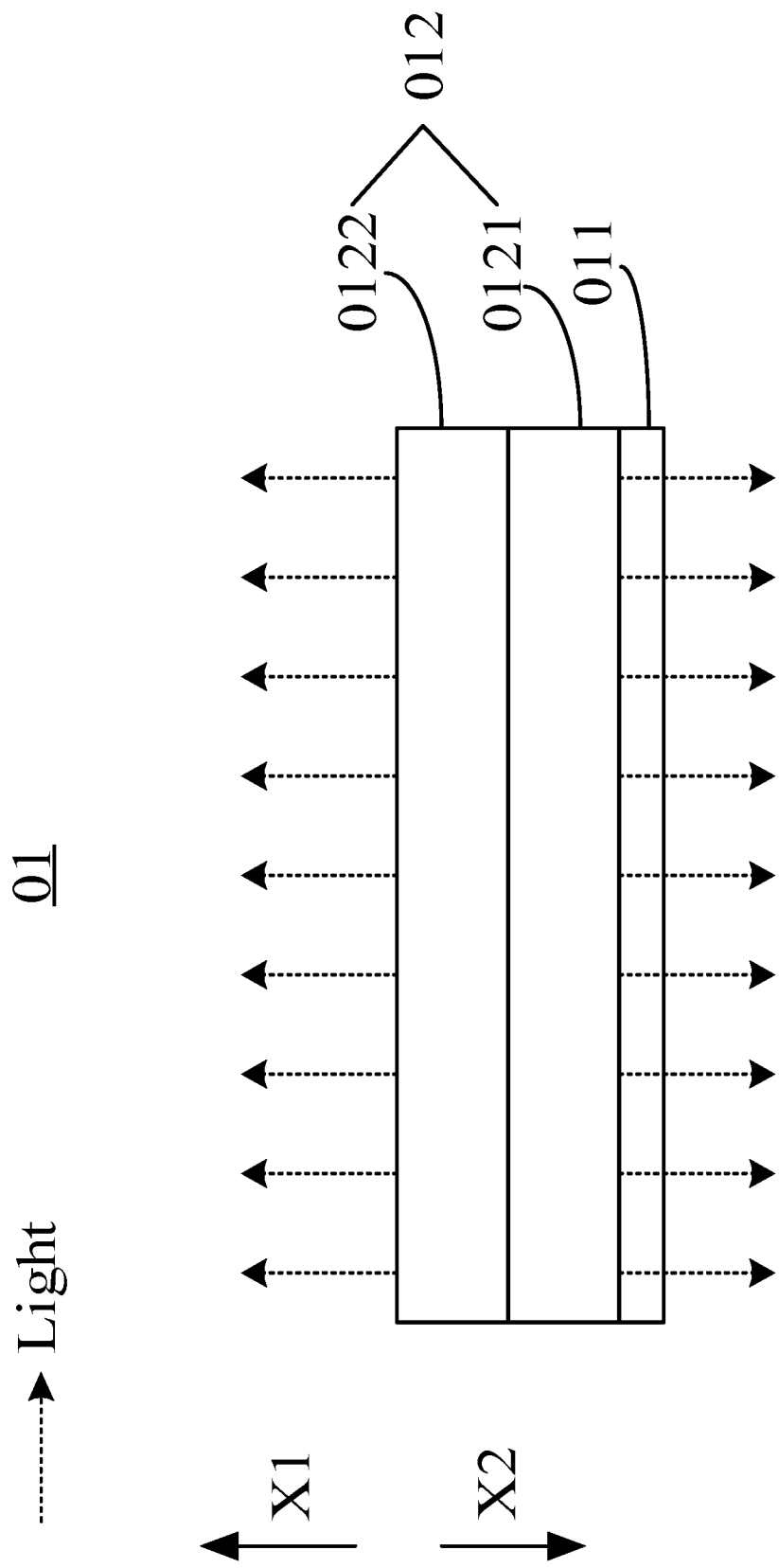
FIG. 1 is a schematic structural diagram of a display substrate according to an embodiment of the present disclosure.

An embodiment of the present disclosure provides a novel display substrate. The display substrate is capable of achieving double-face display, and the display substrate achieves a high resolution. Exemplarily, FIG. 1 is a schematic structural diagram of a display substrate according to an embodiment of the present disclosure. As illustrated in FIG. 1, the display substrate 01 includes: a base substrate 011 and a pixel unit 012.

The base substrate 011 is light transmissive. For example, the base substrate 011 may be made of a transparent material (such as silicon or silicon carbide or the like). The pixel unit 012 may include: a first light emitting structure 0121 and a second light emitting structure 0122 that are arranged in sequence along a direction X1 distal from the base substrate 011. The first light emitting structure 0121 is configured to emit light towards a direction X2 proximal to the base substrate 011, and the second light emitting structure 0122 is configured to emit light towards the direction X1 distal from the base substrate 011. An orthographic projection region of the first light emitting structure 0121 on the base substrate 011 at least partially overlaps an orthographic projection region of the second light emitting structure 0122 on the base substrate 011.

In summary, the display substrate according to the embodiment of the present disclosure includes the first light emitting structure and the second light emitting structure. The first light emitting structure and the second light emitting structure are capable of emitting light towards different directions, such that the display substrate can achieve double-face display. In addition, since the orthographic projection regions of the first light emitting structure and the second light emitting structure on the base substrate at least partially overlap, an orthographic projection region of the pixel unit on the base substrate is small, such that the display substrate may include more pixel units, and thus the display substrate achieves a high resolution.

Optionally, still referring to FIG. 1, the orthographic projection region of the first light emitting structure 0121 on the base substrate 011 may totally overlap the orthographic projection region of the second light emitting structure 0122 on the base substrate 011. In this way, the orthographic projection region of the pixel unit 012 on the base substrate 011 may be maximally reduced, and the number of pixel units 012 in the display substrate 01 may be maximally increased, such that the resolution of the display substrate 01 is improved. It should be noted that in FIG. 1, illustration is given by using the scenario where the orthographic projection region of the first light emitting structure 0121 on the base substrate 011 may totally overlap the orthographic projection region of the second light emitting structure 0122 on the base substrate 011 as an example. Optionally, the orthographic projection region of the first light emitting structure 0121 on the base substrate 011 may also partially overlap the orthographic projection region of the second light emitting structure 0122 on the base substrate 011, which is not limited in the embodiment of the present disclosure.

Figure 2:
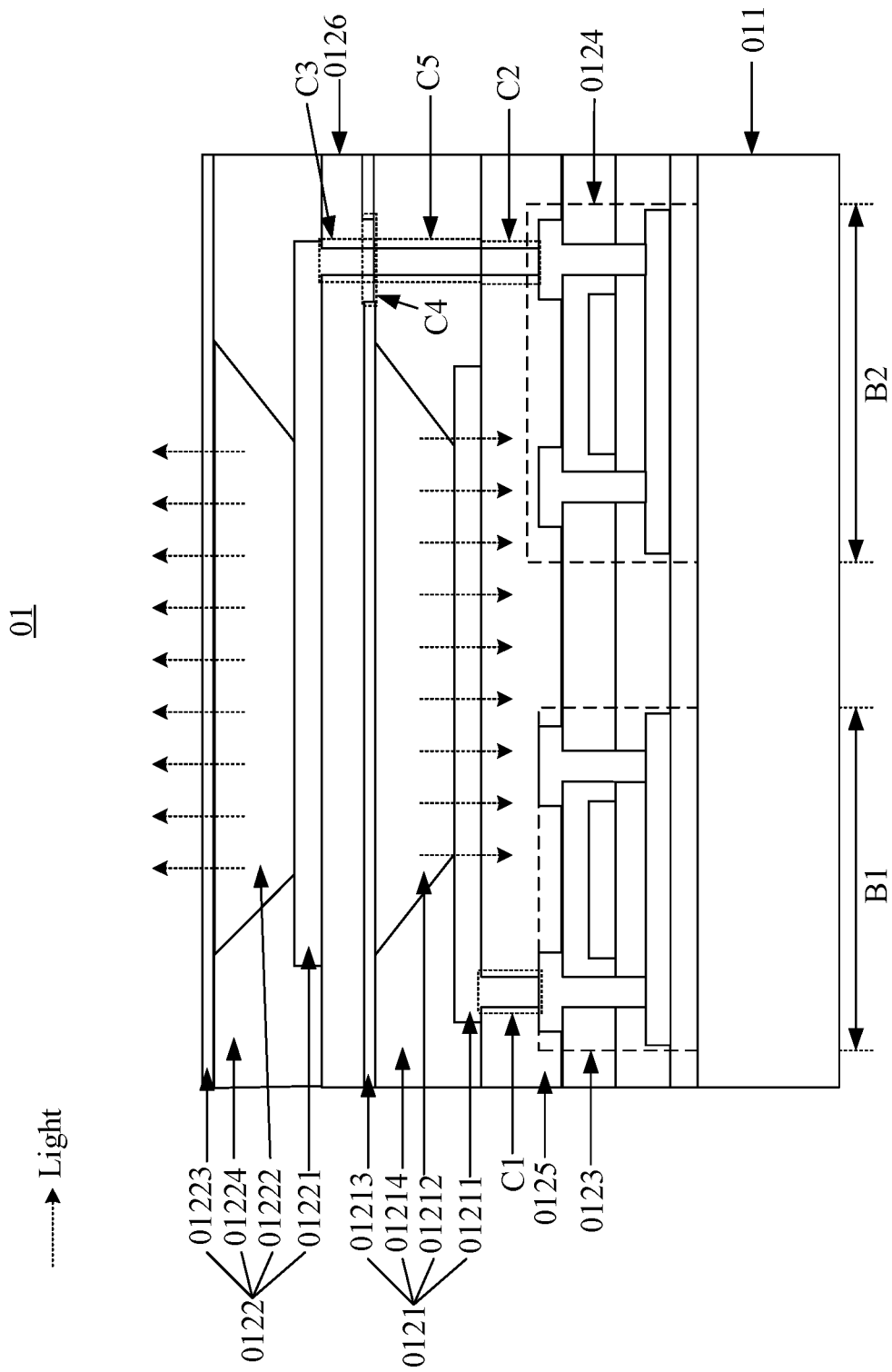
FIG. 2 is a schematic structural diagram of another display substrate according to an embodiment of the present disclosure.

FIG. 2 is a schematic structural diagram of another display substrate according to an embodiment of the present disclosure. As illustrated in FIG. 2, on the basis of FIG. 1, the first light emitting structure 0121 may include: a first bottom electrode 01211, a first light emitting layer 01212 and a first top electrode 01213 that are arranged in sequence along a direction distal from the base substrate 011. The second light emitting structure 0122 may include: a second bottom electrode 01221, a second light emitting layer 01222 and a second top electrode 01223 that are arranged in sequence along the direction distal from the base substrate 011.

Exemplarily, the first light emitting layer 01212 and the second light emitting layer 01222 may be both made of an organic light emitting material. In this case, the first light emitting structure 0121 and the second light emitting structure 0122 may be both organic light emitting diodes. Alternatively, the first light emitting layer 01212 and the second light emitting layer 01222 may be both made of an inorganic light emitting material. In this case, the first light emitting structure 0121 and the second light emitting structure 0122 may be both light emitting diodes. The first light emitting layer 01212 and the second light emitting layer 01222 may also be made of other electroluminescent materials (such as a quantum dot or the like), which is not limited in the embodiment of the present disclosure.

The first bottom electrode 01211 and the second top electrode 01223 are light transmissive. In this way, light emitted by the first light emitting layer 01212 can pass through the first bottom electrode 01211, and can be transmitted along the direction proximal to the base substrate 011; and light emitted by the second light emitting layer 01222 can pass through the second top electrode 01223, and may be transmitted along the direction distal from the base substrate 011. Optionally, the first bottom electrode 01211 and the second top electrode 01223 may be both transparent electrodes, for example, indium tin oxide (ITO) electrodes, or aluminum doped zinc oxide (AZO) electrodes or the like. Alternatively, the first bottom electrode 01211 and the second top electrode 01223 may be both semi-transparent electrodes (for example, electrodes formed by doping metal in a transparent electrode), which is not limited in the embodiment of the present disclosure.

At least one electrode of the first top electrode 01213 and the second bottom electrode 01221 is light shielding (the material of the at least one electrode includes a light shielding material, for example, metal). For example, the first top electrode 01213 is light shielding, and the second bottom electrode 01221 is light transmissive; or the first top electrode 01213 is light transmissive, and the second bottom electrode 01221 is light shielding; or the first top electrode 01213 is light shielding, and the second bottom electrode 01221 is light shielding. In this way, the at least one electrode is capable of stopping light emitted by the first light emitting layer 01212 from being transmitted towards a side where the second light emitting structure 0122 is disposed, and stopping light emitted by the second light emitting layer 01222 from being transmitted towards a side where the first light emitting structure 0121 is disposed, such that mutual interference between the light emitted by the first light emitting structure 0121 and light emitted by the second light emitting structure 0122 is prevented.

Optionally, the electrode according to the embodiment of the present disclosure may achieve the effect of light shielding by reflection, and in this case, the light shielding material may include a light reflective material. Exemplarily, at least one of the first top electrode 01213 and the second bottom electrode 01221 is light reflective. It should be noted that when the first top electrode 01213 is light reflective, a first surface of the first top electrode 01213 proximal to the base substrate 011 is light reflective, and other surfaces except the first surface of the first top electrode 01213 may be light reflective or may be not light reflective, which is not limited in the embodiment of the present disclosure. When the second bottom electrode 01221 is light reflective, a second surface of the second bottom electrode 01221 distal from the base substrate 011 is light reflective, and other surfaces except the second surface of the second bottom electrode 01221 may be light reflective or may be not light reflective, which is not limited in the embodiment of the present disclosure.

Still referring to FIG. 2, the pixel unit may further include: a first pixel circuit 0123 and a second pixel circuit 0124. It should be noted that the pixel circuits (for example, the first pixel circuit and the second pixel circuit) in the embodiment of the present disclosure may include at least one thin film transistor, or the pixel circuits include a plurality of thin film transistors and at least one capacitor. FIG. 2 merely illustrates one thin film transistor in the pixel circuit. The thin film transistor may include: a buffer layer, an active layer, a gate insulation layer, a gate layer, an intermediate insulation layer and a source and drain layer (including a source and a drain) that are arranged in sequence along the direction distal from the base substrate 011.

The first pixel circuit 0123 is electrically connected to the first light emitting structure 0121. For example, the first pixel circuit 0123 is electrically connected to the first bottom electrode 01211 in the first light emitting structure 0121. The second pixel circuit 0124 is electrically connected to the second light emitting structure 0122. For example, the second pixel circuit 0124 is electrically connected to the second bottom electrode 01221 in the second light emitting structure 0122. The display panel where the display substrate 01 is disposed may further include a display control component. Since the first light emitting structure 0121 and the second light emitting structure 0122 are electrically connected to different pixel circuits respectively, the display control component can control, by different pixel circuits, the first light emitting structure and the second light emitting structure to emit light. In this way, each of the first light emitting structure 0121 and the second light emitting structure 0122 may be independently controlled.

Optionally, the first pixel circuit 0123 and the second pixel circuit 0124 may be both disposed between the base substrate 011 and the first light emitting structure 0121. It should be noted that the first pixel circuit 0123 and the second pixel circuit 0124 may be not disposed between the base substrate 011 and the first light emitting structure 0121. For example, the first pixel circuit 0123 and the second pixel circuit 0124 are both disposed on a side of the second light emitting structure 0122 distal from the base substrate 011, which is not limited in the embodiment of the present disclosure.

Still referring to FIG. 2, at least a portion of an orthographic projection region of the first light emitting layer 01212 of the first light emitting structure 0121 on the base substrate 011 may be outside a target region. The target region includes: an orthographic projection region B1 of the first pixel circuit 0123 on the base substrate 011 and an orthographic projection region B2 of the second pixel circuit 0124 on the base substrate 011. After the first light emitting layer 01212 of the first light emitting structure 0121 emits light, since at least a portion of the orthographic projection region of the first light emitting layer 01212 on the base substrate 011 is outside the target region, the first pixel circuit 0123 and the second pixel circuit 0124 do not totally shield the first light emitting layer 01212, and thus at least a portion of the light emitted by the first light emitting layer 01212 can be transmitted towards the base substrate 011 and hence is emitted out of the display substrate.

Figure 3:
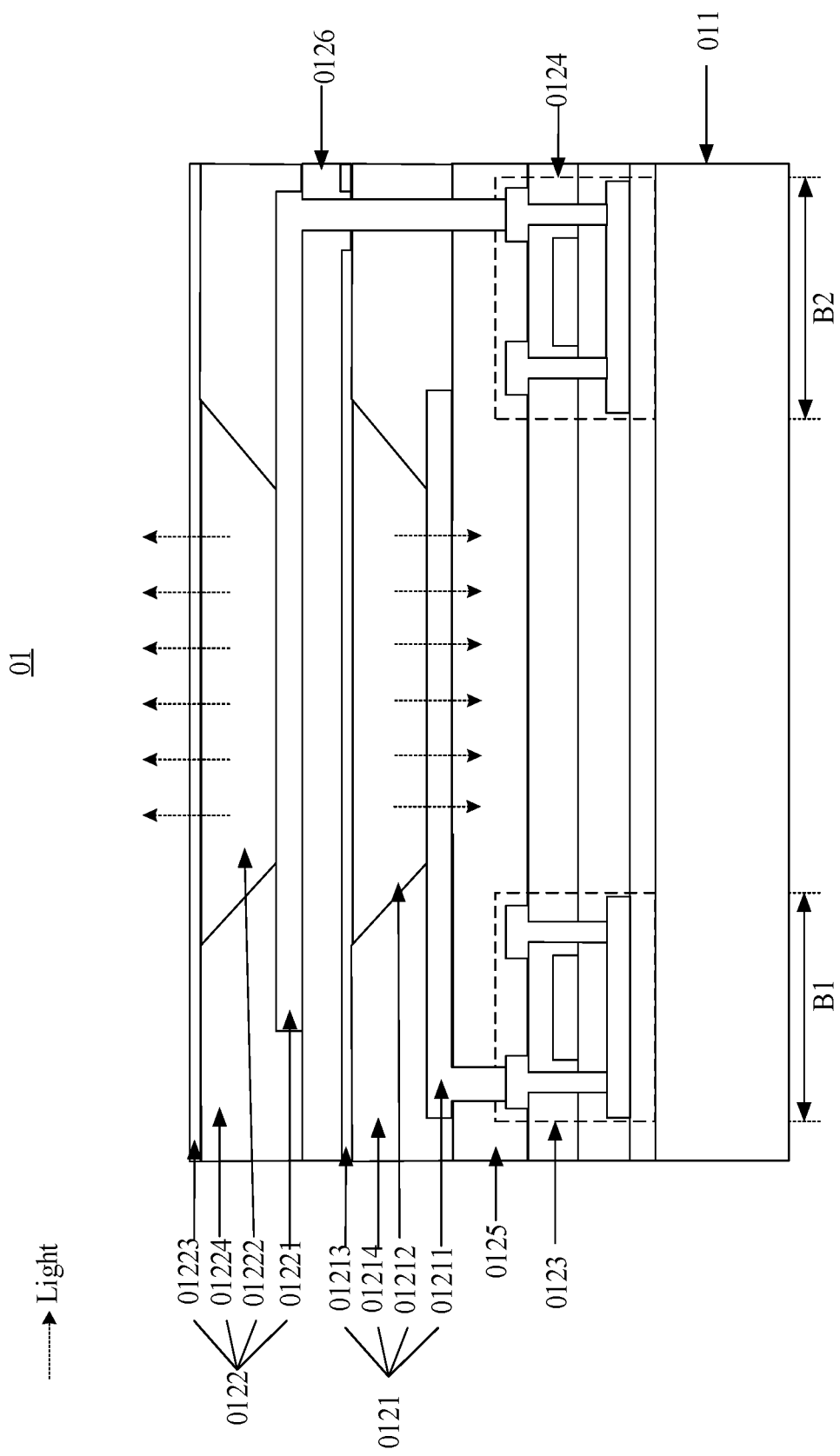
FIG. 3 is a schematic structural diagram of still another display substrate according to an embodiment of the present disclosure.

In FIG. 2, illustration is given by using the scenario where at least a portion of the orthographic projection region of the first light emitting layer 01212 on the base substrate 011 is outside the target region as an example. Optionally, FIG. 3 is a schematic structural diagram of still another display substrate according to an embodiment of the present disclosure. As illustrated in FIG. 3, the orthographic projection region of the first light emitting layer 01212 on the base substrate 011 may be totally outside the target region. In this case, both the first pixel circuit 0123 and the second pixel circuit 0124 do not shield the first light emitting layer 01212, and more light emitted by the first light emitting layer 01212 can be transmitted to the base substrate 011, such that luminance of light emitted from the side where the base substrate 011 is disposed is high.

Still referring to FIG. 2, the pixel unit may further include: a first insulation layer 0125 and a second insulation layer 0126. The first insulation layer 0125 is disposed between a pixel circuit layer and the first light emitting structure 0121, wherein the pixel circuit layer includes the first pixel circuit 0123 and the second pixel circuit 0124. The second insulation layer 0126 is disposed between the first light emitting structure 0121 and the second light emitting layer 0122. The first pixel circuit 0123 is electrically connected to the first light emitting structure 0121 by a first via hole C1 in the first insulation layer 0125, and the second pixel circuit 0124 is electrically connected to the second light emitting structure 0122 by a second via hole C2 in the first insulation layer 0125 and a third via hole C3 in the second insulation layer 0126 in sequence.

Optionally, in the first light emitting structure 0121, an orthographic projection region of an edge portion of the first top electrode 01213 on the base substrate 011 is outside the orthographic projection region of the first light emitting layer 01212 on the base substrate 011, wherein the edge portion may include a target trough hole C4. The second pixel circuit 0124 is electrically connected to the second light emitting structure 0122 by the second via hole C2, the target through hole C4 and the third via hole C3 in sequence, and is insulated from the first top electrode 01213. In addition, in the second light emitting structure 0122, an orthographic projection region of an edge portion of the second top electrode 01223 on the base substrate 011 may also be outside the orthographic projection region of the second light emitting layer 01222 on the base substrate 011.

The display substrate may include a plurality of pixel units (FIG. 2 merely illustrates one pixel unit). The first top electrodes 01213 in the plurality of pixel units may be electrically connected to each other, and may be electrically connected to form an integral structure; or the first top electrodes 01213 in the plurality of pixel units may also be isolated from each other, which is not limited in the embodiment of the present disclosure. The second top electrodes 01223 in the plurality of pixel units may be electrically connected to each other, and may be electrically connected to form an integral structure; or the second top electrodes 01223 in the plurality of pixel units may also be isolated from each other, which is not limited in the embodiment of the present disclosure.

Still referring to FIG. 2, the first light emitting structure 0121 may further include: a first defining layer 01214 disposed between the first bottom electrode 01211 and the first top electrode 01213, wherein the first defining layer 01214 has a first opening, and the first light emitting layer 01212 is in the first opening. The second pixel circuit 0124 is electrically connected to the second light emitting structure 0122 by the second via hole C2, a fourth via hole C5 in the first defining layer 01214, the target through hole C4 and the third via hole C3 in sequence. In addition, the second light emitting structure 0122 may further include: a second defining layer 01224, wherein the second light emitting layer 01222 and the second defining layer 01224 may be both disposed between the second bottom electrode 01221 and the second top electrode 01223. The second defining layer 01224 has a second opening, and the second light emitting layer 01222 is in the second opening.

Figure 4:
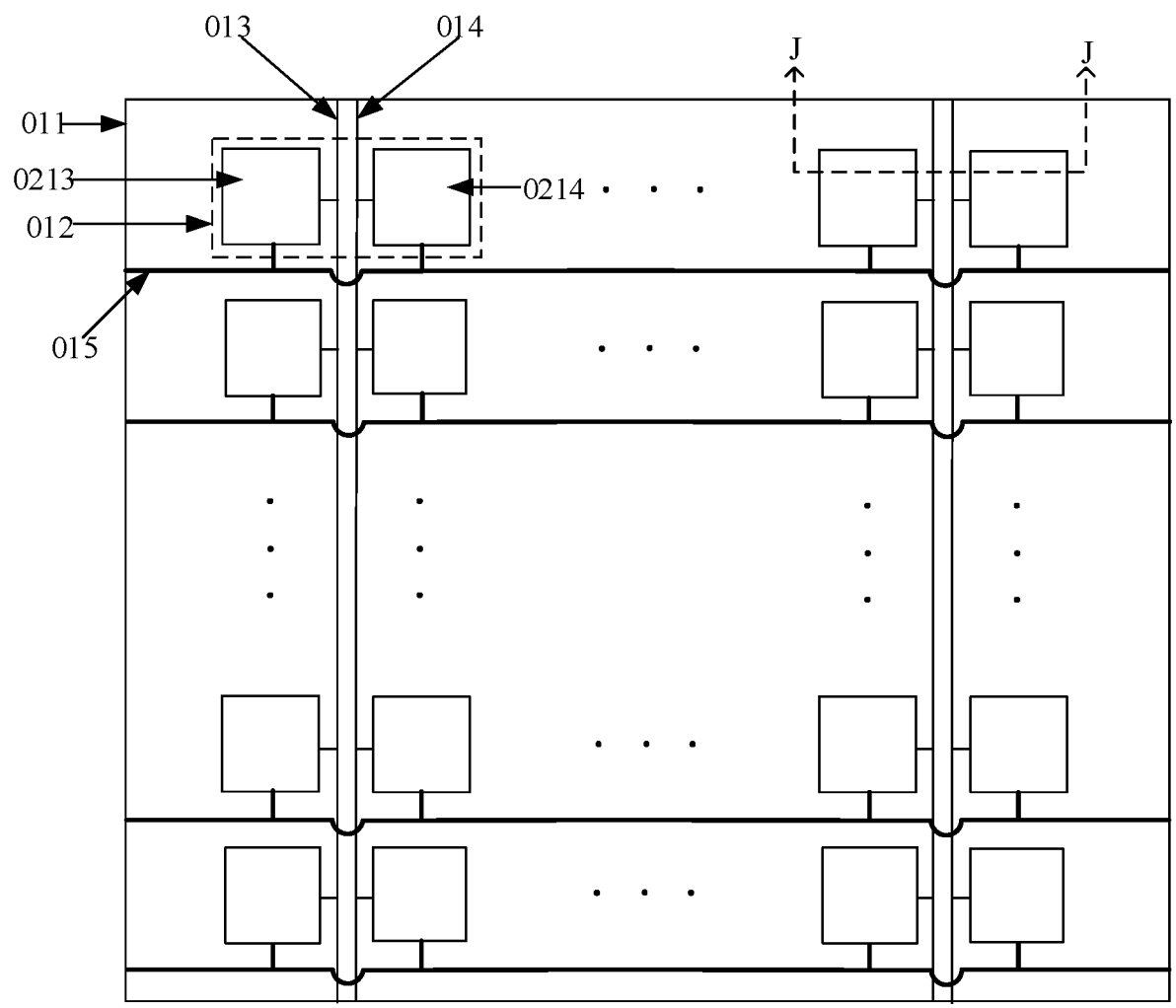
FIG. 4 is a top view of a display substrate according to an embodiment of the present disclosure.

FIG. 4 is a top view of a display substrate according to an embodiment of the present disclosure. FIG. 1, FIG. 2 and FIG. 3 all illustrate a schematic diagram of a cross section JJ in FIG. 4. In addition, none of FIG. 1, FIG. 2 and FIG. 3 illustrates a data line in FIG. 4 (for example, a first data line 013 and a second data line 014) and a gate line 015. FIG. 4 merely illustrates the first pixel circuit 0123 and the second pixel circuit 0124 in the pixel unit, but does not illustrate the first light emitting structure and the second light emitting structure in the pixel unit.

As illustrated in FIG. 4, the display substrate 01 may further include: a first data line 013 and a second data line 014 that are disposed on the base substrate 011. The first data line 013 is electrically connected to the first pixel circuit 0123, and the second data line 014 is electrically connected to the second pixel circuit 0124. It can be known that the first pixel circuit 0123 and the second pixel circuit 0124 are respectively electrically connected to different data lines. In this way, it is convenient for the display control component to control the first light emitting structure and the second light emitting structure by different data lines and different pixel circuits.

Optionally, the first data line 0123 and the second data line 014 may be both disposed between the first pixel circuit 0123 and the second pixel circuit 0124. In addition, the orthographic projection region of the first light emitting layer 01212 on the base substrate may also be at least partially (for example, totally) outside the orthographic projection regions of the first data line 013 and the second data line 014 on the base substrate 011. In this way, the first data line 013 and the second data line 014 shield less light emitted by the first light emitting structure. Optionally, the first data line 013 and the second data line 014 may also not be disposed between the first pixel circuit 0123 and the second pixel circuit 0124. For example, the first data line 013 and the second data line 014 may be disposed on two sides or the same side of the entire pixel unit, which is not limited in the embodiment of the present disclosure.

Still referring to FIG. 4, the display substrate 01 may further include: a gate line 015 disposed on the base substrate 011. The gate line 015 is electrically connected to the first pixel circuit 0123 and the second pixel circuit 0124. It can be known that the first pixel circuit 0123 and the second pixel circuit 0124 in the pixel unit 012 are electrically connected to the same gate line 015.

It should be noted that the display substrate 01 may include m rows and n columns of pixel units 012, wherein $m \geq 1$, and $n \geq 1$. In this case, the display substrate 01 may include m gate lines 015, n first data lines 013 and n second data lines 014. The m gate lines 015 may be in one-to-one correspondence with the m rows of pixel units 012, and each gate line 015 is electrically connected to the first pixel circuit 0123 and the second pixel circuit 0124 of a corresponding row of pixel units 012. The n first data lines 013 may be in one-to-one correspondence with the n columns of pixel units 012, and each first data line 013 may be electrically connected to the first pixel circuit 0123 of a corresponding column of pixel units 012. The n second data lines 014 may be in one-to-one correspondence with the n columns of pixel units 012, and each second data line 014 may be electrically connected to the second pixel circuit 0124 of a corresponding column of pixel units 012.

In summary, the display substrate according to the embodiment of the present disclosure includes the first light emitting structure and the second light emitting structure. The first light emitting structure and the second light emitting structure are capable of emitting light towards different directions, such that the display substrate can achieve double-face display. In addition, since the orthographic projection regions of the first light emitting structure and the second light emitting structure on the base substrate at least partially overlap, the orthographic projection region of the pixel unit on the base substrate is small, such that the display substrate may include more pixel units, and thus the display substrate achieves a high resolution.

Figure 5:
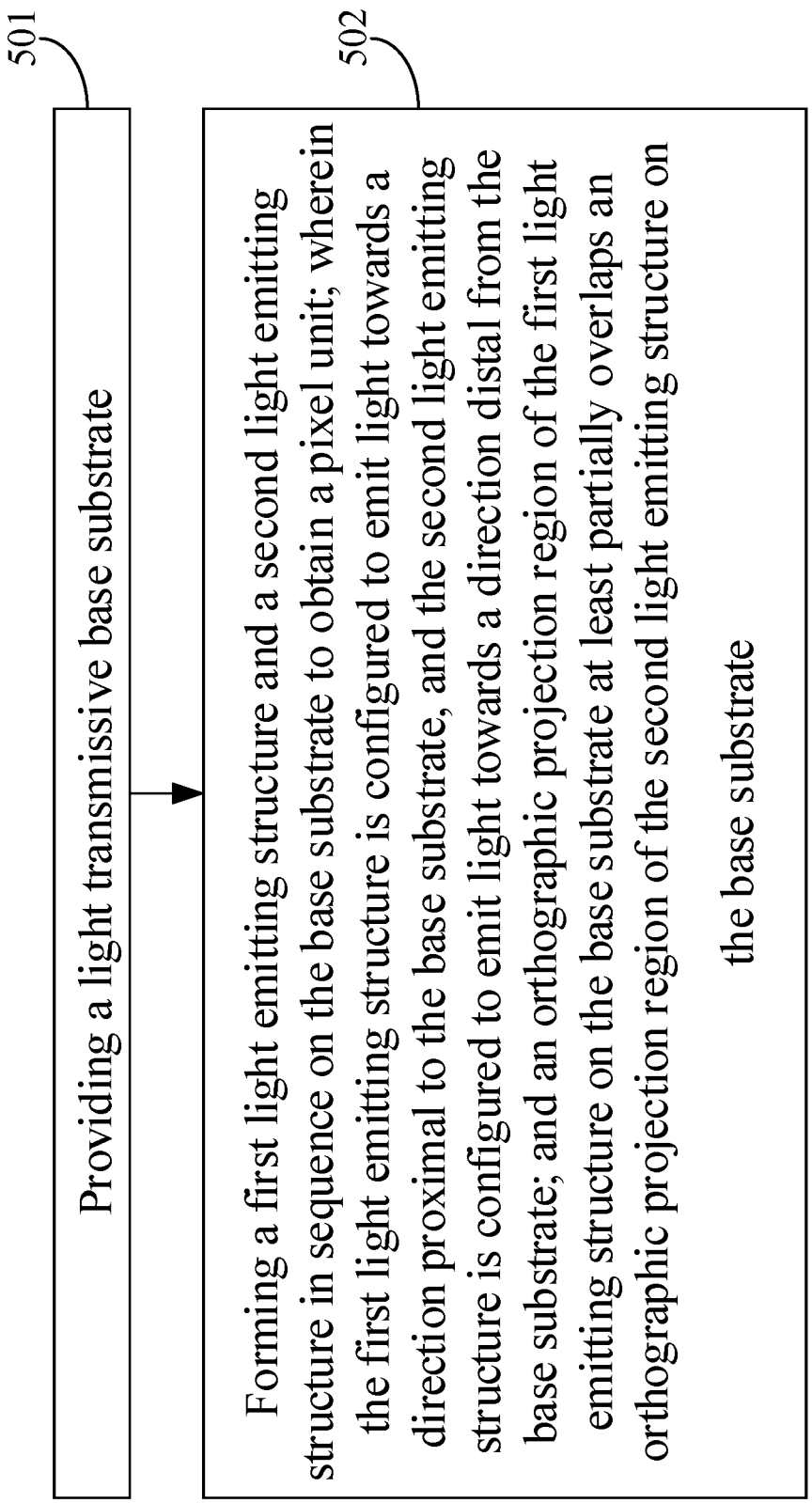
FIG. 5 is a flowchart of a method for manufacturing a display substrate according to an embodiment of the present disclosure.

FIG. 5 is a flowchart of a method for manufacturing a display substrate according to an embodiment of the present disclosure. The method may be applied to manufacture the display substrate according to the embodiment of the present disclosure (for example, the display substrate as illustrated in FIG. 1, FIG. 2, FIG. 3 or FIG. 4). As illustrated in FIG. 5, the method may include the following steps.

In step 501, a light transmissive base substrate is provided.

In step 502, a first light emitting structure and a second light emitting structure formed in sequence on the base substrate to obtain a pixel unit. The first light emitting structure is configured to emit light towards a direction proximal to the base substrate, and the second light emitting structure is configured to emit light towards a direction distal from the base substrate; and an orthographic projection region of the first light emitting structure on the base substrate at least partially overlaps an orthographic projection region of the second light emitting structure on the base substrate.

In summary, the display substrate manufactured by using the method according to the embodiment of the present disclosure includes the first light emitting structure and the second light emitting structure. The first light emitting structure and the second light emitting structure are capable of emitting light towards different directions, such that the display substrate can achieve double-face display. In addition, since the orthographic projection regions of the first light emitting structure and the second light emitting structure on the base substrate at least partially overlap, the orthographic projection region of the pixel unit on the base substrate is small, such that the display substrate may include more pixel units, and thus the display substrate achieves a high resolution.

Figure 6:
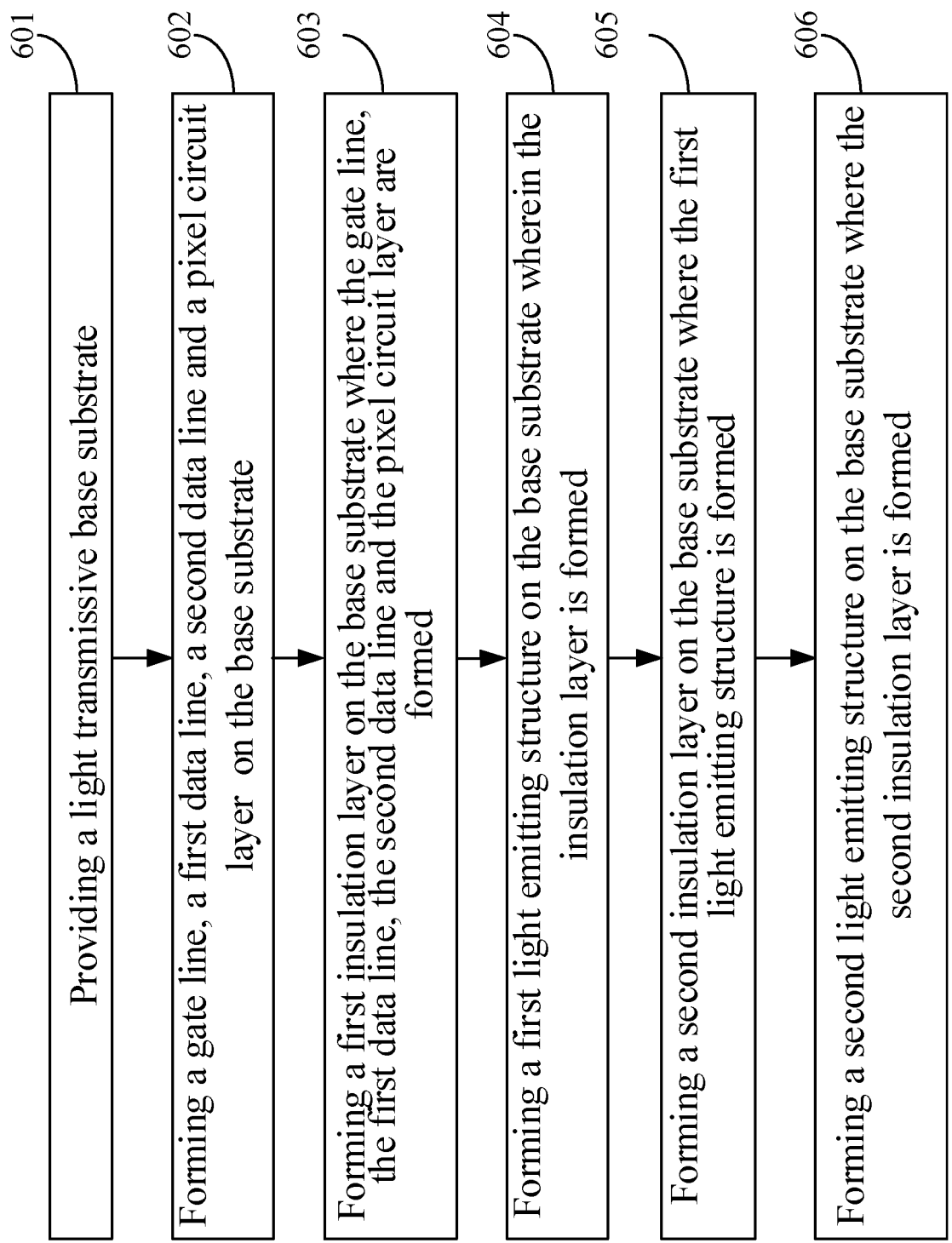
FIG. 6 is a flowchart of another method for manufacturing a display substrate according to an embodiment of the present disclosure.

FIG. 6 is a flowchart of another method for manufacturing a display substrate according to an embodiment of the present disclosure. As illustrated in FIG. 6, the method may include the following steps.

In step 601, a light transmissive base substrate is provided.

In step 601, a base substrate that is made of a transparent material may be provided. The transparent material may be silicon, silicon carbide or the like.

In step 602, a gate line, a first data line, a second data line and a pixel circuit layer are formed on the base substrate.

Figure 7:
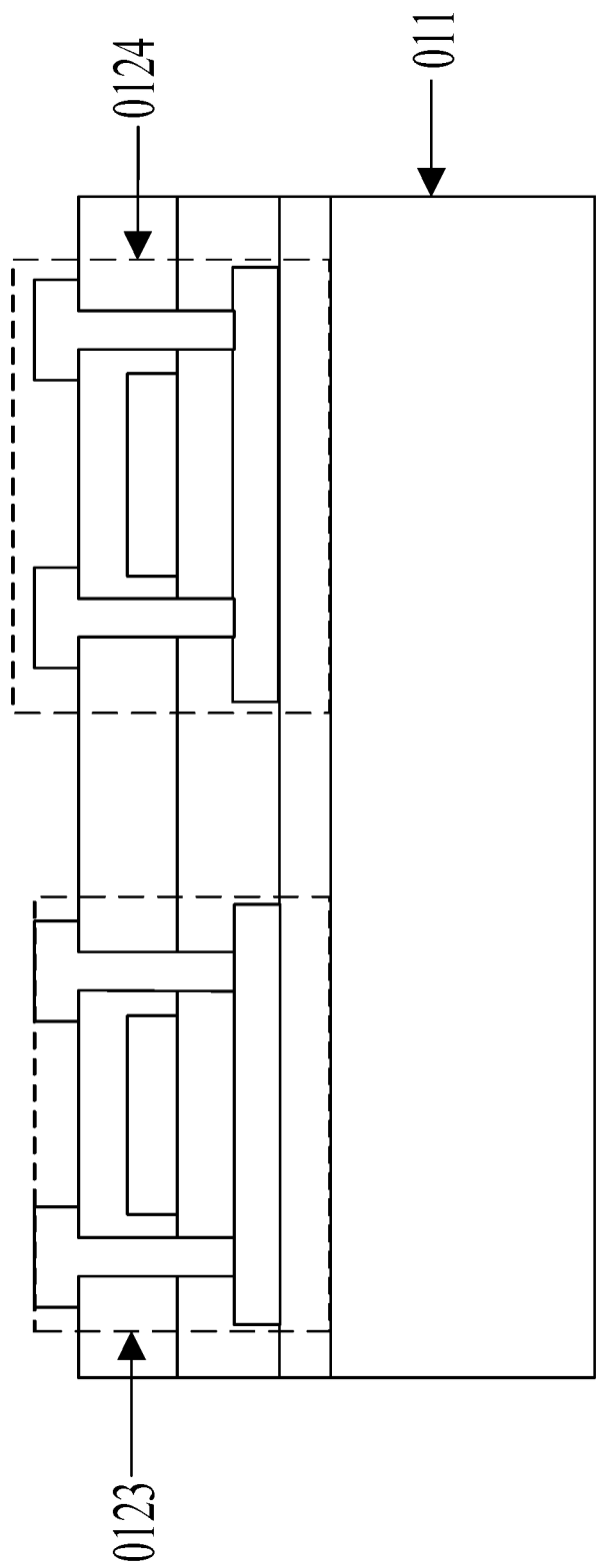
FIG. 7 is a schematic diagram of a process of manufacturing a display substrate according to an embodiment of the present disclosure.

The pixel circuit layer formed on the base substrate may be as illustrated in FIG. 7 (FIG. 7 does not illustrate the gate line, the first data line and the second data line). The pixel circuit layer may include the first pixel circuit 0123 and the second pixel circuit 0124 of the pixel unit. The gate line may be electrically connected to both the first pixel circuit and the second pixel circuit, the first data line may be electrically connected to the first pixel circuit, and the second data line may be electrically connected to the second pixel circuit. It should be noted that when the display substrate manufactured according to the embodiment of the present disclosure includes a plurality of pixel circuits, the pixel circuit layer may include the first pixel circuits and the second pixel circuits of the plurality of pixel units.

In step 603, a first insulation layer is formed on the base substrate where the gate line, the first data line, the second data line and the pixel circuit layer are formed.

Figure 8:
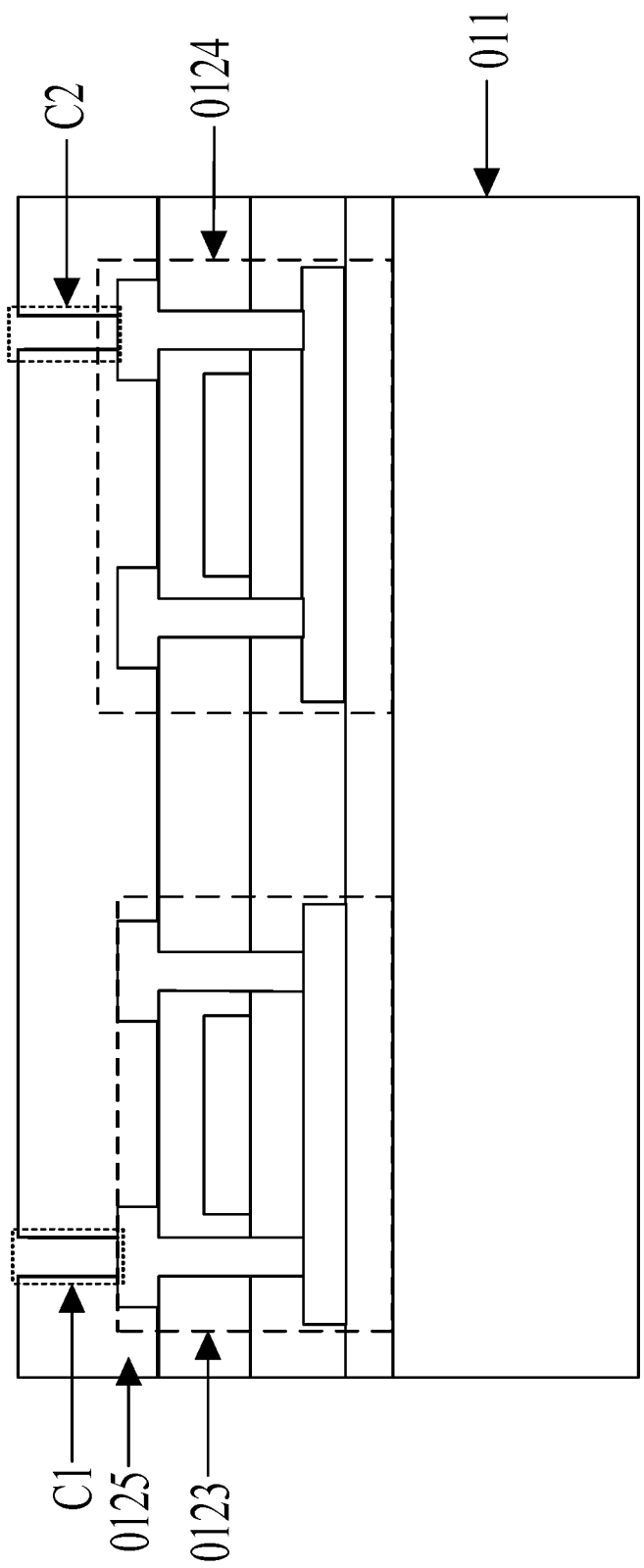
FIG. 8 is a schematic diagram of another process of manufacturing a display substrate according to an embodiment of the present disclosure.

During forming of the first insulation layer, an insulation material layer may be firstly formed on the pixel circuit layer, and a first via hole and a second via hole may be formed in the insulation material layer to obtain the first insulation layer 0125 as illustrated in FIG. 8. The first via hole C1 in the first insulation layer 0125 is in communication with the first pixel circuit 0123, and the second via hole C2 is in communication with the second pixel circuit 0124.

In step 604, a first light emitting structure is formed on the base substrate where the first insulation layer is formed.

Figure 9:
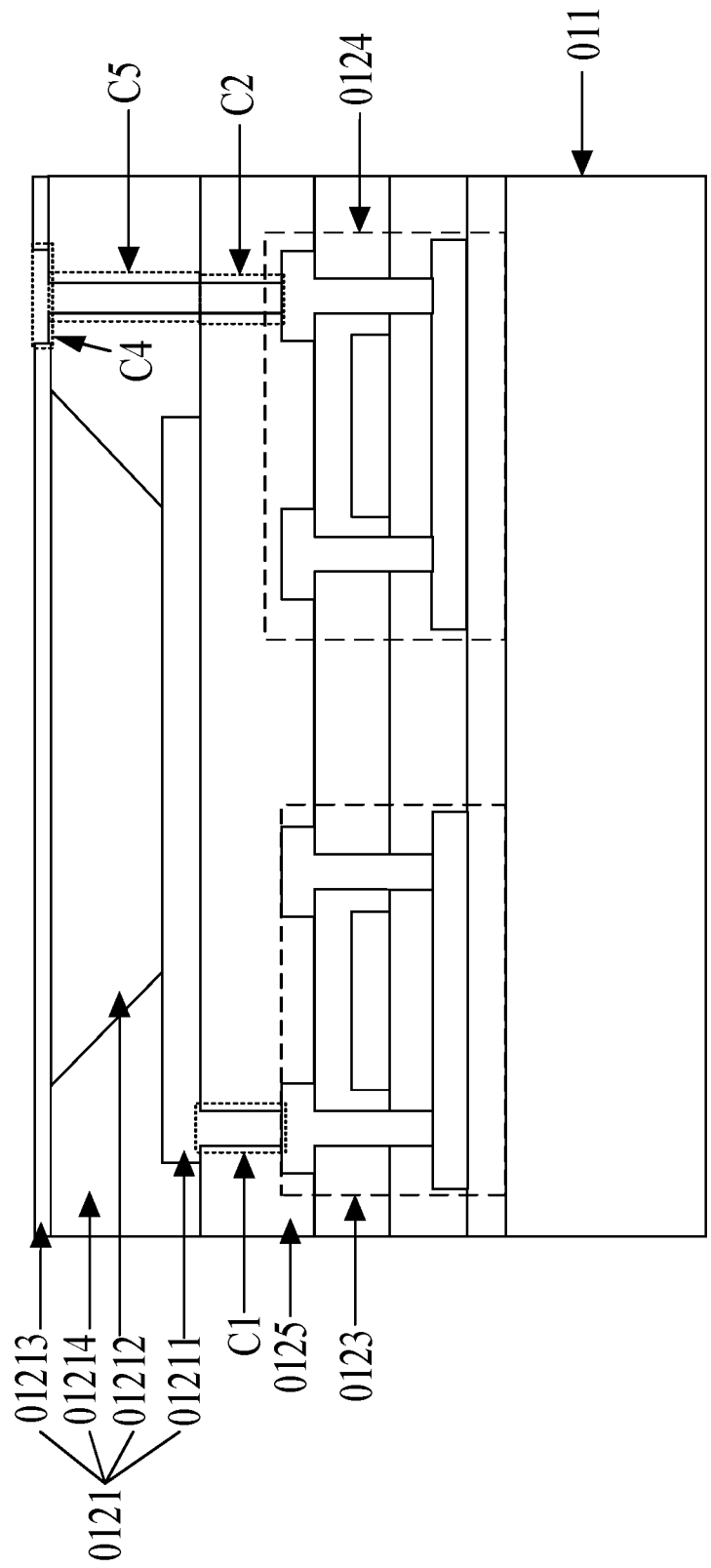
FIG. 9 is a schematic diagram of still another process of manufacturing a display substrate according to an embodiment of the present disclosure.

Exemplarily, the first light emitting structure may include: a first bottom electrode, a first light emitting layer, a first top electrode and a first defining layer. During forming of the first light emitting structure, the first bottom electrode may be firstly formed on the first insulation layer, and the first bottom electrode may be electrically connected to the first pixel circuit by the first via hole in the first insulation layer. Afterwards, the first defining layer including a first opening and a fourth via hole is formed on the first bottom electrode. Then, the first light emitting layer may be formed in the first opening, and finally the first top electrode covering the first defining layer and the first light emitting layer and including a target through hole may be formed, to obtain the first light emitting structure 0121 as illustrated in FIG. 9. The target through hole C4 in the first top electrode 01214 is in communication with the fourth via hole C5 in the first defining layer 01214, and the fourth via hole C5 in the first defining layer 01213 is in communication with the second via hole C2 in the first insulation layer 0125.

Optionally, when the display substrate manufactured according to the embodiment of the present disclosure includes a plurality of pixel units, the first top electrodes of the plurality of pixel units may be connected to form an integral structure. In this case, the first top electrodes of the plurality of pixel units may be simultaneously formed.

In step 605, a second insulation layer is formed on the base substrate where the first light emitting structure is formed.

Figure 10:
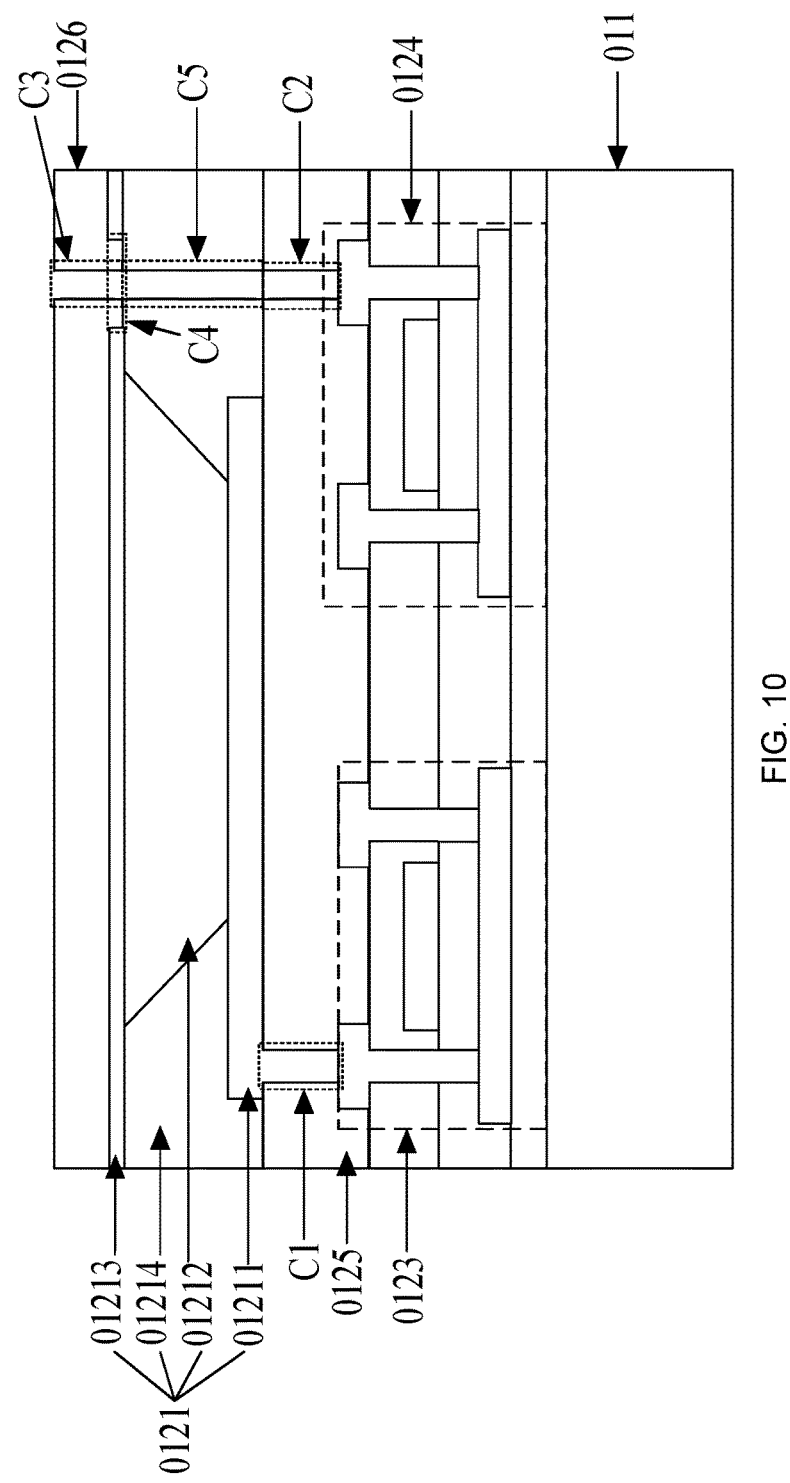
FIG. 10 is a schematic diagram of yet still another process of manufacturing a display substrate according to an embodiment of the present disclosure.

During forming of the second insulation layer, an insulation material layer may be firstly formed on the first light emitting structure, and a third via hole may be formed in the insulation material layer to obtain the second insulation layer 0126 as illustrated in FIG. 10. The second via hole C3 in the first insulation layer 0126 is in communication with the target through hole C4 in the first top electrode 01213.

In step 606, a second light emitting structure is formed on the base substrate where the second insulation layer is formed.

Figure 11:
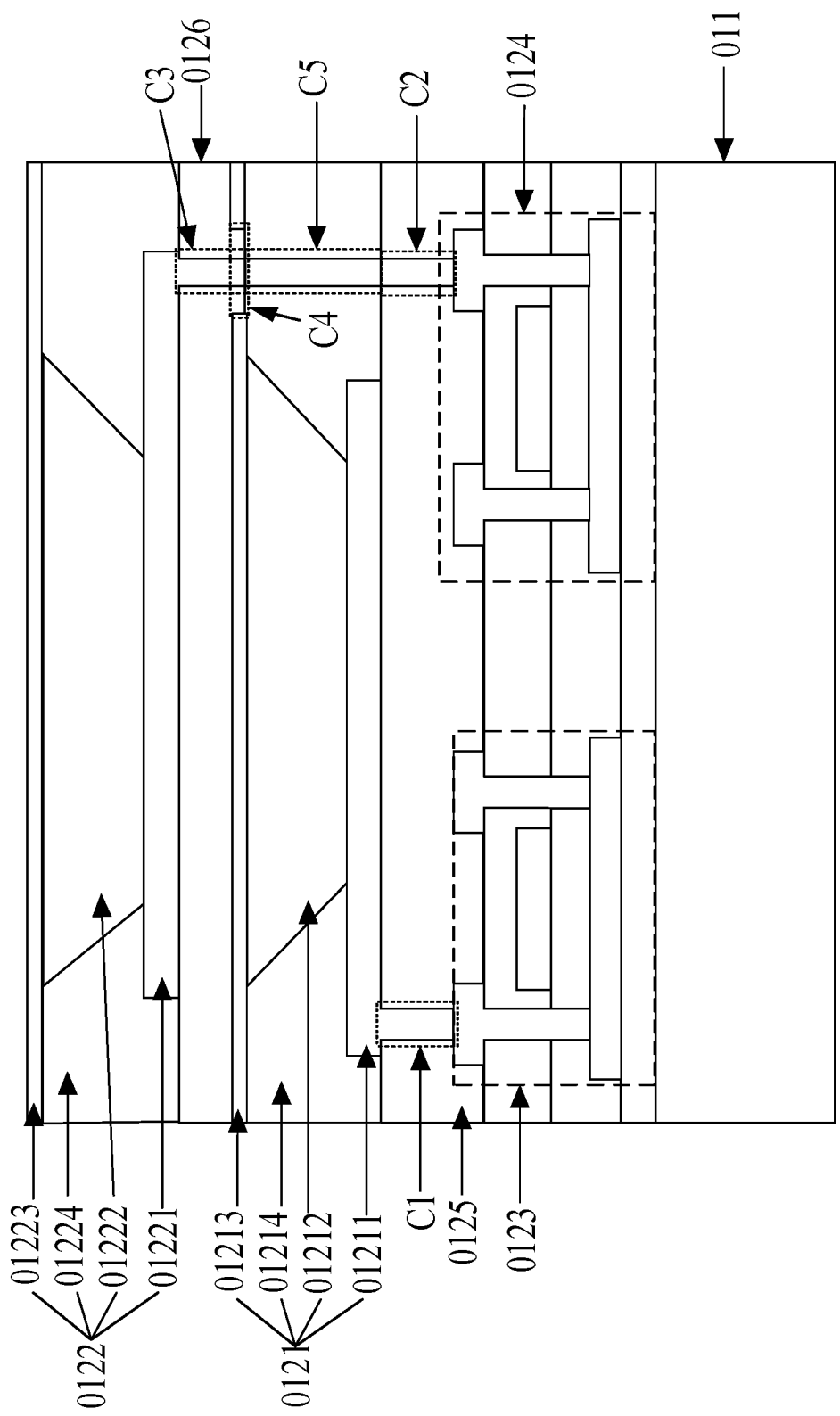
FIG. 11 is a schematic diagram of yet still another process of manufacturing a display substrate according to an embodiment of the present disclosure.

Exemplarily, the second light emitting structure may include: a second bottom electrode, a second light emitting layer, a second top electrode and a second defining layer. During forming of the second light emitting structure, the second bottom electrode may be firstly formed on the second insulation layer, and the second bottom electrode is electrically connected to the second pixel circuit via the second via hole, the fourth via hole, the target through hole and the third via hole in sequence. Afterwards, the second defining layer including a second opening is formed on the second bottom electrode. Then, the second light emitting layer may be formed in the second opening, and finally the second top electrode covering the second defining layer and the second light emitting layer may be formed, to obtain the second light emitting structure 0122 as illustrated in FIG. 11.

Optionally, when the display substrate manufactured according to the embodiment of the present disclosure includes a plurality of pixel units, the second top electrodes of the plurality of pixel units may be connected to form an integral structure. In this case, the second top electrodes of the plurality of pixel units may be simultaneously formed.

In summary, the display substrate manufactured by using the method according to the embodiment of the present disclosure includes the first light emitting structure and the second light emitting structure. The first light emitting structure and the second light emitting structure are capable of emitting light towards different directions, such that the display substrate can achieve double-face display. In addition, since the orthographic projection regions of the first light emitting structure and the second light emitting structure on the base substrate at least partially overlap, the orthographic projection region of the pixel unit on the base substrate is small, such that the display substrate may include more pixel units, and thus the display substrate achieves a high resolution.

An embodiment of the present disclosure further provides a display panel. The display panel may include the display substrate according to the embodiments of the present disclosure (for example, the display substrate as illustrated in FIG. 1, FIG. 2, FIG. 3 or FIG. 4).

Optionally, the display panel may further include a cover plate. The cover plate and the base substrate of the display substrate face each other, and the pixel unit of the display substrate is disposed between the cover plate and the base substrate. The cover plate is light transmissive. For example, the cover plate may be made of silicon or silicon carbide or the like.

Figure 12:
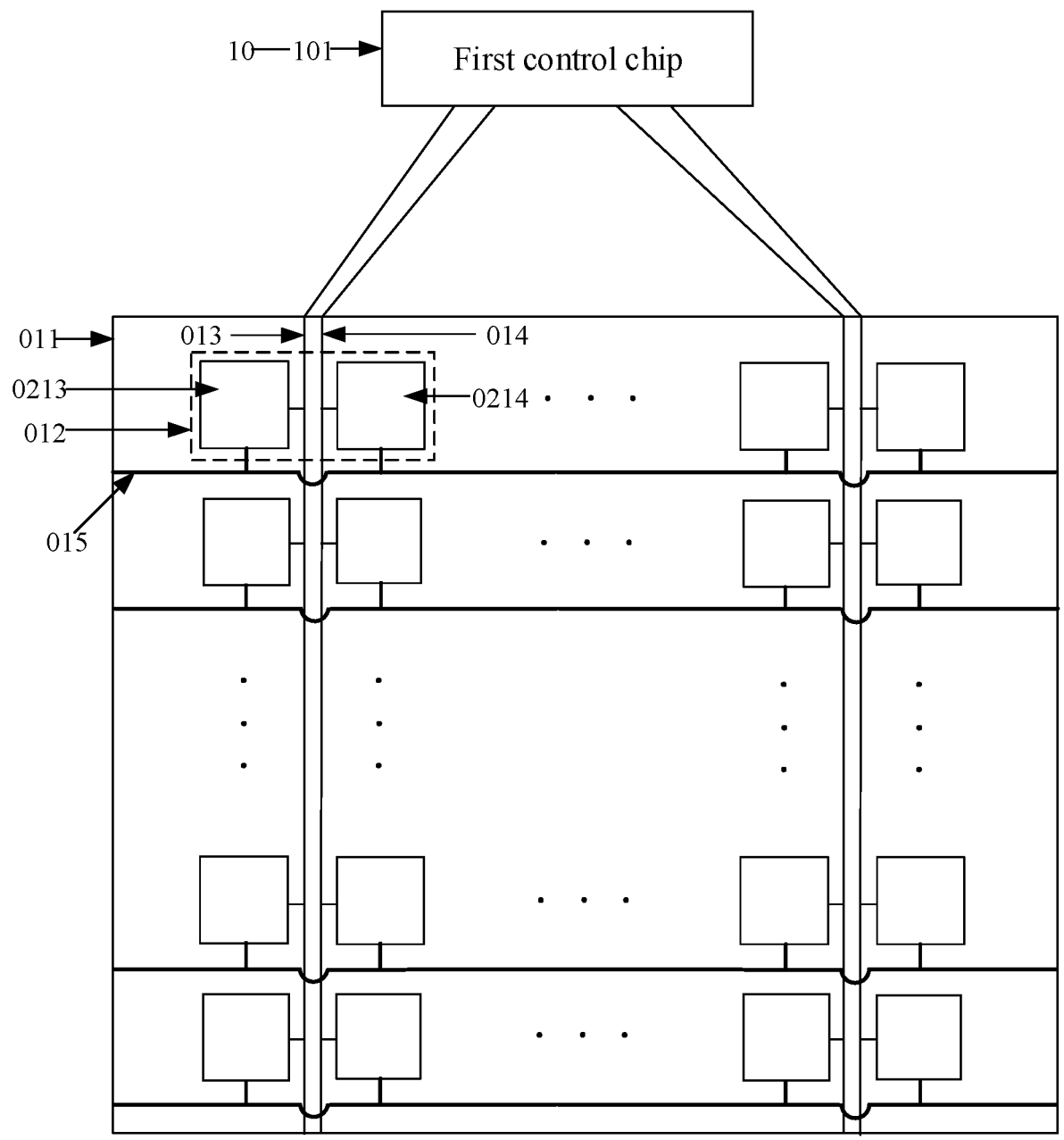
FIG. 12 is a schematic structural diagram of a display apparatus according to an embodiment of the present disclosure.

An embodiment of the present disclosure further provides a display apparatus. The display apparatus may include the display panel according to the embodiment of the present disclosure and a display control component. Exemplarily, FIG. 12 is a schematic structural diagram of a display apparatus according to an embodiment of the present disclosure. As illustrated in FIG. 12, the display apparatus may include: a display control component 10 and a display panel. It should be noted that FIG. 12 merely illustrates the display substrate of the display panel, and in FIG. 12, illustration is given by using the display substrate as illustrated in FIG. 4 as the display substrate as an example.

The display control component 10 is connected to the first light emitting structure and the second light emitting structure of the pixel unit 012 in the display substrate. The display control component 10 may be configured to control at least one of the first light emitting structure and the second light emitting structure to emit light. Exemplarily, the display control component 10 may be configured to: control the first light emitting structure and the second light emitting structure to emit light, or control the first light emitting structure to emit light, or control the second light emitting structure to emit light. When the display control component 10 controls each light emitting structure to emit light, a data signal may be provided for the light emitting structure, such that the light emitting structure emits light under the effect of the data signal. Optionally, the display control component provides the same data signal or different data signals for the first light emitting structure and the second light emitting structure, which is not limited in the embodiment of the present disclosure.

In summary, the display apparatus according to the embodiment of the present disclosure includes the first light emitting structure and the second light emitting structure. The first light emitting structure and the second light emitting structure are capable of emitting light towards different directions, such that the display substrate can achieve double-face display. In addition, since the orthographic projection regions of the first light emitting structure and the second light emitting structure on the base substrate at least partially overlap, the orthographic projection region of the pixel unit on the base substrate is small, such that the display substrate may include more pixel units, and thus the display substrate achieves a high resolution.

Still referring to FIG. 12, the pixel unit 012 may further include: a first pixel circuit 0123 and a second pixel circuit 0124. The display control component 10 may be electrically connected to the first light emitting structure by the first pixel circuit 0123, and may be electrically connected to the second light emitting structure by the second pixel circuit 0124.

Further, the display panel further includes: a first data line 013 and a second data line 014. The display control component 10 may be electrically connected to the first pixel circuit 0123 by the first data line 013, and may be electrically connected to the second pixel circuit 0124 by the second data line 014. In this case, the display control component 10 is electrically connected to the first light emitting structure by the first data line 013 and the first pixel circuit 0123 in sequence, and is electrically connected to the second light emitting structure by the second data line 014 and the second pixel circuit 0124 in sequence.

The display control component 10 in FIG. 12 may include a control chip (for example, a first control chip 101 in FIG. 12). The first control chip 101 is electrically connected to all the data lines in the display panel, and controls, by the data lines, the first light emitting structure and the second light emitting structure of the display panel to emit light. It should be noted that in FIG. 12, illustration is given by using the scenario where the display control component 10 includes one control chip as an example. However, the display control component 10 may also include a plurality of control chips, which is not limited in the embodiment of the present disclosure. When the display control component 10 includes two control chips, one of the two control chips may be electrically connected to the first light emitting structure of the display panel, and may be configured to control the first light emitting structure to emit light. The other of the two control chips may be electrically connected to the second light emitting structure, and may be configured to provide a data signal for the second light emitting structure.

Figure 13:
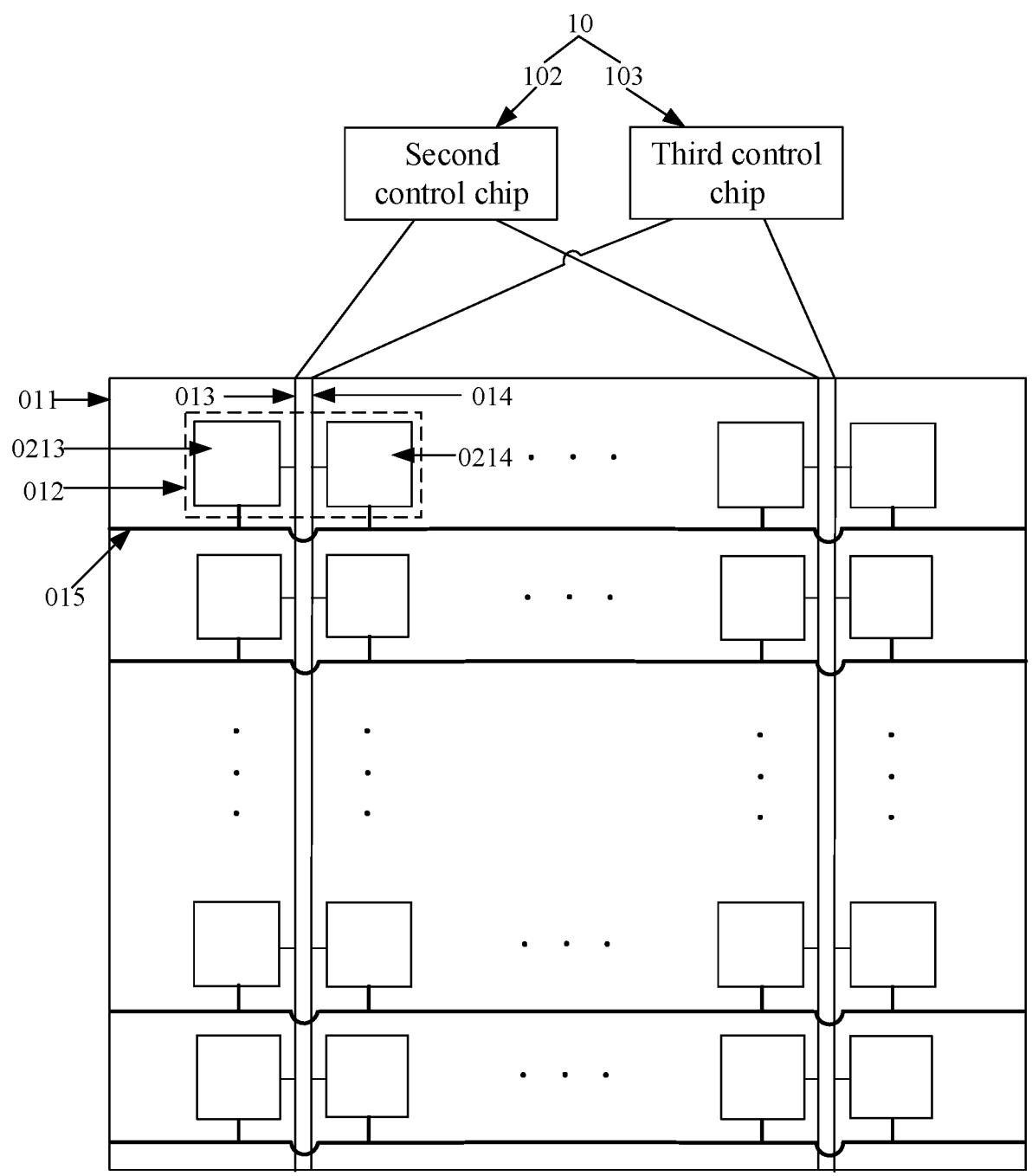
FIG. 13 is a schematic structural diagram of another display apparatus according to an embodiment of the present disclosure.

Exemplarily, FIG. 13 is a schematic structural diagram of another display apparatus according to an embodiment of the present disclosure. As illustrated in FIG. 13, the two control chips in the display control component 10 may be a second control chip 102 and a third control chip 103 respectively. The second control chip 102 is electrically connected to the first data line 013 of the display panel, and is configured to control, by the first data line 013 and the first pixel circuit 0123, the first light emitting structure to emit light. The third control chip 103 is electrically connected to the second data line 014 of the display panel, and is configured to control, by the second data line 014 and the second pixel circuit 0124, the second light emitting structure to emit light.

Exemplarily, the display apparatus may be electronic paper, a mobile phone, a tablet computer, a television, a display, a laptop computer, a digital photo frame, a navigator or the like product or part having the display function.

In summary, the display apparatus according to the embodiment of the present disclosure includes the first light emitting structure and the second light emitting structure. The first light emitting structure and the second light emitting structure are capable of emitting light towards different directions, such that the display substrate is capable of achieving double-face display. In addition, since the orthographic projection regions of the first light emitting structure and the second light emitting structure on the base substrate at least partially overlap, the orthographic projection region of the pixel unit on the base substrate is small, such that the display substrate may include more pixel units, and thus the display apparatus where the display substrate is disposed achieves a high resolution.

FIG. 14 is a flowchart of a method for controlling a display panel according to an embodiment of the present disclosure. The method may be performed by the display control component in the above display apparatus to control the display panel in the display apparatus. As illustrated in FIG. 14, the method may include the following steps.

In step 1401, a data signal is provided for at least one light emitting structure of the first light emitting structure and the second light emitting structure, such that the at least one light emitting structure emits light.

It should be noted that the display control component is electrically connected to the first light emitting structure by the first data line and the first pixel circuit in sequence, and is electrically connected to the second light emitting structure by the second data line and the second pixel circuit in sequence. Therefore, where the display control component needs to provide a data signal for the first light emitting structure, the display control component may input a data signal to the first data line, such that the data signal is input to the first light emitting structure via the first data line and the first pixel circuit. Where the display control component needs to provide a data signal for the second light emitting structure, the display control component may input a data signal to the second data line, such that the data signal is input to the second light emitting structure via the second data line and the second pixel circuit.

In addition, the display control component according to the embodiment may include one control chip or a plurality of control chips. When the display control component includes two control chips, one of the two control chips needs to provide a data signal for the first light emitting structure according to an image to be displayed on a side where the base substrate of the display panel is disposed, and the other of the two control chips needs to provide a data signal for the second light emitting structure according to an image to be displayed on a side opposite to the side where the base substrate of the display panel is disposed.

The display apparatus according to the embodiment supports a single-face display mode and a double-face display mode. In the single-face display mode, the display apparatus may display images on a single face; and in the double-face display mode, the display apparatus may display images on double faces. In addition, when the display apparatus displays images on double faces, the same image or different images may be displayed on the double faces.

In one aspect, in the single-face display mode of the display apparatus, if an image needs to be displayed on the side where the base substrate of the display apparatus is disposed, in step 1401, the display control component may provide a data signal for the first light emitting structure of the display apparatus according to the image to be displayed, such that at least a portion of the first light emitting structure of the display apparatus emits light. If an image needs to be displayed on the side opposite to the side where the base substrate of the display apparatus is disposed, in step 1401, the display control component may provide a data signal for the second light emitting structure of the display apparatus according to the image to be displayed, such that at least a portion of the second light emitting structure of the display apparatus emits light.

In another aspect, in the double-face display mode of the display apparatus, it is assumed that a first image needs to be displayed on a side where the base substrate of the display panel is disposed, and a second image needs to be displayed on a side opposite to the side where the base substrate of the display panel is disposed. Then in step 1401, the display control component may provide a first data signal for the first light emitting structure according to the first image, such that at least a portion of the first light emitting structure emits light. The display control component may also provide a second data signal for the second light emitting structure according to the second image, such that at least a portion of the second light emitting structure emits light. The first image may be the same as or different from the second image, which is not limited in the embodiment of the present disclosure.

It should be noted that the embodiment of the display substrate, the embodiment of the method for manufacturing the display substrate, and the embodiment of the method for controlling the display substrate may be cross referenced, which is not limited in the embodiments of the present disclosure. The sequence of the steps in the method embodiments of the present disclosure may be suitably adjusted, and the steps may be deleted or added according to the actual needs. Variations that can be readily derived by a person skilled in the art within the technical scope of the present disclosure shall fall within the protection scope of the present disclosure, which are thus not described herein any further.

It should be noted that in the accompanying drawings, for clarity of the illustration, the dimension of the layers and regions may be scaled up. It can be understood that when an element or layer is described as being "above" another element or layer, the described element or layer may be directly on the other element or layer, or at least one intermediate layer may be arranged between the described element or layer and the other element or layer. In addition, It may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole text described above, similar reference numerals denote similar elements.

In addition, the terms "first" and "second" are merely for the illustration purpose, and shall not be construed as indicating or implying a relative importance. Unless otherwise specified, the term "plurality of" refers to two or more than two.

Other embodiments of the present disclosure will be apparent to those skilled in the art from consideration of the specification and practice of the present disclosure. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the present disclosure being indicated by the following claims.

It should be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A display substrate, comprising: a base substrate and a pixel unit;
    wherein the base substrate is light transmissive, and the pixel unit comprises a first light emitting structure and a second light emitting structure that are disposed in sequence along a direction distal from the base substrate; an orthographic projection region of the first light emitting structure on the base substrate at least partially overlapping an orthographic projection region of the second light emitting structure on the base substrate; and
    the first light emitting structure is configured to emit light towards a direction proximal to the base substrate, and the second light emitting structure is configured to emit light towards a direction distal from the base substrate;
    wherein the pixel unit further comprises: a first pixel circuit and a second pixel circuit;
    the first pixel circuit is electrically connected to the first light emitting structure, and the second pixel circuit is electrically connected to the second light emitting structure; and
    the first pixel circuit and the second pixel circuit are between the base substrate and the first light emitting structure.

2. The display substrate according to claim 1, wherein the orthographic projection region of the first light emitting structure on the base substrate totally overlaps the orthographic projection region of the second light emitting structure on the base substrate.

3. The display substrate according to claim 1, wherein the first light emitting structure comprises: a first bottom electrode, a first light emitting layer and a first top electrode that are arranged in sequence along a direction distal from the base substrate; and the second light emitting structure comprises: a second bottom electrode, a second light emitting layer and a second top electrode that are arranged in sequence along the direction distal from the base substrate;

wherein the first bottom electrode and the second top electrode are light transmissive, and materials of at least one electrode of the first top electrode and the second bottom electrode include a light shielding material.

4. The display substrate according to claim 3, wherein the light shielding material comprises a light reflective material.

5. The display substrate according to claim 4, wherein the at least one electrode satisfies at least one of the following conditions:

the at least one electrode comprises the first top electrode, and a surface of the first top electrode proximal to the base substrate is light reflective; and the at least one electrode comprises the second bottom electrode, and a surface of the second bottom electrode distal from the base substrate is light reflective.

6. The display substrate according to claim 1, wherein the first light emitting structure comprises a first bottom electrode, a first light emitting layer and a first top electrode that are arranged in sequence along a direction distal from the base substrate;

wherein at least a portion of an orthographic projection region of the first light emitting layer on the base substrate is outside a target region, the target region comprising orthographic projection regions of the first pixel circuit and the second pixel circuit on the base substrate.

7. The display substrate according to claim 6, wherein the orthographic projection region of the first light emitting layer on the base substrate is totally outside the target region.

8. The display substrate according to claim 1, wherein the display substrate further comprises: a first data line and a second data line that are on the base substrate;

wherein the first data line is electrically connected to the first pixel circuit, and the second data line is electrically connected to the second pixel circuit.

9. The display substrate according to claim 8, wherein the first data line and the second data line are between the first pixel circuit and the second pixel circuit.

10. The display substrate according to claim 1, wherein the display substrate further comprises: a gate line on the base substrate, the gate line being electrically connected to the first pixel circuit and the second pixel circuit.

11. The display substrate according to claim 1, wherein the pixel unit further comprises: a first insulation layer and a second insulation layer; wherein the first insulation layer is between a pixel circuit layer and the first light emitting structure, the pixel circuit layer comprising the first pixel circuit and the second pixel circuit; and the second insulation layer is between the first light emitting structure and the second light emitting structure; and the first pixel circuit is electrically connected to the first light emitting structure by a first via hole in the first insulation layer, and the second pixel circuit is electrically connected to the second light emitting structure by a second via hole in the first insulation layer and a third via hole in the second insulation layer in sequence.

12. The display substrate according to claim 11, wherein an orthographic projection region of an edge portion of the first top electrode on the base substrate is outside an orthographic projection region of the first light emitting layer on the base substrate, the edge portion comprising a target trough hole; and the second pixel circuit is electrically connected to the second light emitting structure by the second via hole, the target through hole and the third via hole in sequence, and is insulated from the first top electrode.

13. The display substrate according to claim 12, wherein the first light emitting structure further comprises: a first defining layer between the first bottom electrode and the first top electrode, the first defining layer comprising a first opening, the first light emitting layer being in the first opening; and the second pixel circuit is electrically connected to the second light emitting structure by the second via hole, a fourth via hole in the first defining layer, the target through hole and the third via hole in sequence.

14. The display substrate according to claim 13, wherein the orthographic projection region of the first light emitting structure on the base substrate totally overlaps the orthographic projection region of the second light emitting structure on the base substrate;

the first light emitting structure comprises: a first bottom electrode, a first light emitting layer and a first top electrode that are arranged in sequence along a direction distal from the base substrate; and the second light emitting structure comprises: a second bottom electrode, a second light emitting layer and a second top electrode that are arranged in sequence along the direction distal from the base substrate;

wherein the first bottom electrode and the second top electrode are light transmissive, and materials of at least one electrode of the first top electrode and the second bottom electrode include a light shielding material; a surface of the first top electrode proximal to the base substrate is light reflective, and a surface of the second bottom electrode distal from the base substrate is light reflective;

an orthographic projection region of the first light emitting layer on the base substrate is totally outside a target region, the target region comprising orthographic projection regions of the first pixel circuit and the second pixel circuit on the base substrate;

the display substrate further comprises: a first data line and a second data line that are on the base substrate; wherein the first data line is electrically connected to the first pixel circuit, and the second data line is electrically connected to the second pixel circuit; the first data line and the second data line are between the first pixel circuit and the second pixel circuit; and the display substrate further comprises: a gate line on the base substrate, the gate line being electrically connected to the first pixel circuit and the second pixel circuit.

15. A method for manufacturing a display panel, wherein the method is used for manufacturing the display panel according to claim 1, the method comprising:

providing a light transmissive base substrate; and forming a first light emitting structure and a second light emitting structure in sequence on the base substrate to obtain a pixel unit;

wherein an orthographic projection region of the first light emitting structure on the base substrate at least partially overlapping an orthographic projection region of the second light emitting structure on the base substrate;

the first light emitting structure is configured to emit light towards a direction proximal to the base substrate, and the second light emitting structure is configured to emit light towards a direction distal from the base substrate.

16. A display panel, comprising the display substrate according to claim 1.

17. A display apparatus, comprising: a display control component, and the display panel according to claim 16;

wherein the display control component is electrically connected to a first light emitting structure and a second light emitting structure in the display panel, and is configured to control at least one of the first light emitting structure and the second light emitting structure to emit light.

18. The display apparatus according to claim 17, wherein the display apparatus satisfies at least one of the following conditions:

the pixel unit further comprises a first pixel circuit and a second pixel circuit, and the display panel further comprise a first data line and a second data line;

the display control component is electrically connected to the first light emitting structure by the first data line and the first pixel circuit in sequence, and is electrically connected to the second light emitting structure by the second data line and the second pixel circuit in sequence;

one of the two control chips is electrically connected to the first light emitting structure, and is configured to control the first light emitting structure to emit light; and the other of the two control chips is electrically connected to the second light emitting structure, and is configured to control the second light emitting structure to emit light.

* * * * *